US006801455B2

(12) United States Patent
Natori

(10) Patent No.: US 6,801,455 B2
(45) Date of Patent: Oct. 5, 2004

(54) VOLTAGE GENERATION CIRCUIT FOR NON-VOLATILE SEMICONDUCTOR MEMORY DEVICE

(75) Inventor: Kanji Natori, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/639,643

(22) Filed: Aug. 13, 2003

(65) Prior Publication Data

US 2004/0061139 A1 Apr. 1, 2004

(30) Foreign Application Priority Data

Sep. 11, 2002 (JP) .......................... 2002-265359

(51) Int. Cl.[7] .............................................. G11C 16/04
(52) U.S. Cl. .............................. 365/185.18; 365/189.09; 365/226
(58) Field of Search ....................... 365/189.09, 185.18, 365/226

(56) References Cited

U.S. PATENT DOCUMENTS

| 5,214,606 | A | * | 5/1993 | Hashimoto | ............. | 365/185.22 |
|---|---|---|---|---|---|---|
| 5,408,115 | A | | 4/1995 | Chang | ......................... | 257/324 |
| 5,422,504 | A | | 6/1995 | Chang et al. | ........... | 365/185.15 |
| 5,494,838 | A | | 2/1996 | Chang et al. | ................ | 438/264 |
| 5,671,179 | A | * | 9/1997 | Javanifard | ............. | 365/185.33 |
| 5,969,383 | A | | 10/1999 | Chang et al. | ................ | 257/316 |
| 6,069,518 | A | * | 5/2000 | Nakai et al. | ................. | 327/535 |
| 6,128,242 | A | * | 10/2000 | Banba et al. | ................ | 365/226 |
| 6,160,736 | A | * | 12/2000 | Kurosaki | ................ | 365/185.23 |
| 6,177,318 | B1 | | 1/2001 | Ogura et al. | ................ | 438/267 |
| 6,248,633 | B1 | | 6/2001 | Ogura et al. | ................ | 438/267 |
| 6,255,166 | B1 | | 7/2001 | Ogura et al. | ................ | 438/257 |
| 6,262,926 | B1 | * | 7/2001 | Nakai | ......................... | 365/200 |
| 6,434,080 | B1 | * | 8/2002 | Shiga | .................... | 365/230.08 |
| 6,437,636 | B2 | * | 8/2002 | Zammattio et al. | ......... | 327/536 |

FOREIGN PATENT DOCUMENTS

| JP | A 07-16851 | 6/1995 |
|---|---|---|
| JP | B1 2978477 | 9/1999 |
| JP | A 2001-156188 | 6/2001 |

OTHER PUBLICATIONS

Hayashi, Yutaka et al. "Twin MONOS Cell with Dual Control Gates." *2000 Symposium on VLSI Technology Digest of Technical Papers.*
Chang, Kuo–Tung et al. "A New SONOS Memory Using Source–Side Injection for Programming." *IEE Electron Device Letters,* vol. 19, No. 7, Jul. 1998, pp. 253–255.
Chen, Wie–Ming et al. "A Novel Flash Memory Device with SPlit Gate Source Side Injection and Ono Charge Storage Stack (SPIN)." *1997 Symposium on VLSI Technology Digest of Technical Papers.* Pp. 63–64.

* cited by examiner

*Primary Examiner*—Son Mai
(74) *Attorney, Agent, or Firm*—Oliff & Berridge, PLC

(57) ABSTRACT

A voltage generation circuit of the invention applied for a non-volatile semiconductor memory device has a memory cell array including multiple non-volatile memory elements. The voltage generation circuit includes a booster circuit having at least a first booster module that boosts a power supply voltage and outputs a first boosted voltage corresponding to either of a program mode and an erase mode, and a second booster module that boosts the power supply voltage and outputs a second boosted voltage, which is different from the first boosted voltage, corresponding to a verify mode. The voltage generation circuit also includes a control voltage generation circuit that generates at least a voltage corresponding to the program mode, based on the first boosted voltage, in the program mode, a voltage corresponding to the erase mode, based on the first boosted voltage, in the erase mode, and a voltage corresponding to the verify mode, based on the second boosted voltage, in the verify mode, as control voltages to control operations of each of the multiple non-volatile memory elements. This arrangement effectively shortens each erase/program access time.

10 Claims, 7 Drawing Sheets

Fig.6

| REFERENCE VOLTAGE | STANDBY | READ | VERIFY | | ERASE | PROGRAM |
|---|---|---|---|---|---|---|
| | | | ERASE | PROGRAM | | |
| | HV1 (5V) | HV1 (5V) | HV2 (5V) | HV2 (5V) | HV3 (8V) | HV3 (8V) |
| VPCGL | Vcc | 1.5V | 1.2V | 1.8V | Vcc | 2.5V |
| VPCGH | ≒3V | 3V | 3V | 3V | Vcc | 5.5V |
| VPYS | Vcc | 4.5V | 4.5V | 4.5V | 8V | 8V |
| VPBL | Vcc | Vcc | Vcc | Vcc | 5.2V | 5.2V |

VOLTAGE GENERATION CIRCUIT FOR NON-VOLATILE SEMICONDUCTOR MEMORY DEVICE

BACKGROUND OF THE INVENTION

1. Field of the Invention

The present invention relates to a voltage generation circuit used for a non-volatile semiconductor memory device. More specifically the invention pertains to a voltage generation circuit including a booster circuit to boost a power supply voltage and output boosted voltages corresponding to respective working modes.

2. Description of the Related Art

In semiconductor memory devices, read, program (write), and erase operations to each of memory cells, which are arranged in a matrix to construct a memory cell array, are implemented by specifying an address in both a row direction and a column direction.

A voltage applied to a signal line in the row direction and to a signal line in the column direction, which are connected with each memory cell, is regulated to gain access to a specified memory cell for a selected operation among the read, program, and erase operations. For selection of the specified memory cell, a voltage, which is different from the voltage applied to the other memory cells, is to be generated from a power supply voltage and to be applied to the specified memory cell.

MONOS (metal-oxide-nitride-oxide-semiconductor or -substrate) memory devices have been developed recently as non-volatile semiconductor memory devices that are electrically erasable. In such MONOS-type non-volatile semiconductor memory devices, each memory cell has two memory elements as discussed in detail in a cited reference Y. Hayashi et al., 2000 Symposium on VLSI Technology Digest of Technical Papers, p122–p123.

As described in this cited reference, it is required to apply multiple voltages on signal lines (control lines) corresponding to the respective memory cells as control voltages, in order to gain access to the memory elements in the MONOS-type non-volatile semiconductor memory device via the respective signal lines (control lines). Various levels of control voltages are also required for respective working modes (read, program, erase, and standby) with regard to each memory element.

Such control voltages are generated by a voltage generation circuit. The voltage generation circuit typically includes a booster circuit that boosts a power supply voltage to voltages corresponding to the respective working modes, and a control voltage generation circuit that generates multiple control voltages from the boosted voltages in the respective working modes. The booster circuit boosts, for example, a power supply voltage of 1.8 V to a higher voltage of 8.0 V and outputs the higher voltage of 8.0 V in the program (write) mode or in the erase mode, while boosting the power supply voltage of 1.8 V to a lower voltage of 5.0 V and outputting the lower voltage of 5.0 V in the read mode or in the standby mode.

The excessively long program time or erase time to the non-volatile memory element undesirably makes the non-volatile memory element fall into an over program state or in an over erase state, which may result in malfunctions.

The technique to prevent the occurrence of the over program state or the over erase state divides a required time for the program operation or the erase operation to one non-volatile memory element into multiple short time intervals and carries out multiple program and erase operations. At each time of the program or erase operation, a read operation from the memory element as the target of the program or the erase operation is executed to verify the status of the program or the status of the erase. This read operation is called the 'verify' operation. Multiple sets of the program and verify combination (hereafter referred to as the 'program access') or the erase and verify combination (hereafter referred to as the 'erase access') are repeated until completion of the program or erase operation to the memory element. The program access and the erase access are genetically called the 'erase/program access'.

In order to prevent the over program state or the over erase state and ensure the effective program access or the erase access, the preferable technique minimizes the erase/program access time and maximizes the executable number of erase/program accesses within a conventional erase/program access time.

The prior art voltage generation circuit including the booster circuit, however, has a problem discussed below.

FIG. 8 shows a problem of the booster circuit included in the prior art voltage generation circuit. The booster circuit switches over the output voltage between the lower voltage of 5.0 V corresponding to the read mode and the higher voltage of 8.0 V corresponding to the program mode or the erase mode. A charge pump is applied for the booster circuit. The charge pump iteratively accumulates the power supply voltage in response to clock signals and thereby outputs available boosted voltages. The charge pump generally has a poor response to the switchover of the output voltage. The booster circuit has a capacitor for voltage accumulation and a parasitic capacitor. Charge and discharge of electric charges into and from these capacitors worsen the response to the switchover of the output voltage generated by the booster circuit according to the working mode. The booster circuit thus generally requires a relatively long time to set a voltage corresponding to each working mode ready for output. For example, as shown in the graph of FIG. 8, the switchover time of the output in the booster circuit is approximately 1 $\mu$s.

A relatively long time is accordingly required to make the verify operation executable after execution of a first program or erase operation. A relatively long time is also required to make a second program or erase operation executable after execution of the verify operation. This undesirably lengthens the time required to make the second program access or erase access executable after execution of the first program access or erase access.

In the illustrated example, each program or erase time is about 1 $\mu$s, the verify time is about 300 ns, and the switchover time of the output in the booster circuit is about 1 $\mu$s. The total erase/program access time is thus about 3.3 $\mu$s. The executable number of erase/program accesses is thus only three times at the maximum within a conventional erase/program access time of approximately 10 $\mu$s in the prior art non-volatile semiconductor memory devices.

SUMMARY OF THE INVENTION

The object of the present invention is thus to solve the problem of the prior art technique and to provide a voltage generation circuit for a non-volatile semiconductor memory device, which shortens each erase/program access time and thereby increases the executable number of erase/program accesses within a conventional erase/program access time.

In order to attain at least part of the above and the other related objects, the present invention is directed to a voltage generation circuit applied for a non-volatile semiconductor memory device, which has a memory cell array including multiple non-volatile memory elements. The non-volatile semiconductor memory device has plural working modes, that is, a program mode for writing into each of the multiple non-volatile memory elements, an erase mode for erasing from each of the multiple non-volatile memory elements, a verify mode for reading each of the multiple non-volatile memory elements to verify either of a status of the writing and a status of the erasing, and a read mode for reading from each of the multiple non-volatile memory elements.

The voltage generation circuit includes: a booster circuit having at least a first booster module that boosts a power supply voltage and outputs a first boosted voltage corresponding to either of the program mode and the erase mode, and a second booster module that boosts the power supply voltage and outputs a second boosted voltage, which is different from the first boosted voltage, corresponding to the verify mode; and a control voltage generation circuit that generates at least a voltage corresponding to the program mode, based on the first boosted voltage, in the program mode, a voltage corresponding to the erase mode, based on the first boosted voltage, in the erase mode, and a voltage corresponding to the verify mode, based on the second boosted voltage, in the verify mode, as control voltages to control operations of each of the multiple non-volatile memory elements.

The control voltage generation circuit included in the voltage generation circuit of the invention generates the voltage corresponding to either the program mode or the erase mode as the control voltage, based on the first boosted voltage output from the first booster module, in the program mode or in the erase mode. The control voltage generation circuit also generates the voltage corresponding to the verify mode as the control voltage, based on the second boosted voltage output from the second booster module, in the verify mode. This structure generates the control voltages in the respective working modes, based on the boosted voltages output from the different booster modules, that is, from the first booster module in the program mode or in the erase mode and from the second booster module in the verify mode. The arrangement enables the first booster module to be set ready for output of the first boosted voltage and the second booster module to be set ready for output of the second boosted voltage.

This structure effectively solves the problem of the prior art technique that requires a relatively long time to switch over the output voltage between the boosted voltage corresponding to the program mode or the erase mode and the boosted voltage corresponding to the verify mode. The arrangement thus desirably shortens each erase/program access time and increases the executable number of erase/program accesses within a conventional erase/program access time.

In one preferable embodiment of the voltage generation circuit of the invention, the booster circuit further includes a third booster module that boosts the power supply voltage and outputs a third boosted voltage corresponding to the read mode. The control voltage generation circuit generates a voltage corresponding to the read mode as the control voltage, based on the third boosted voltage, in the read mode.

In this preferable structure, the third booster module may be set ready to output the third boosted voltage corresponding to the read mode. At a start of the read mode, the voltage corresponding to the read mode can be generated within a short time period as a control voltage, based on the third boosted voltage set ready for output.

In one preferable application of the voltage generation circuit of the invention, the control voltage generation circuit generates a voltage corresponding to the read mode as the control voltage, based on the second boosted voltage, in the read mode.

In another preferable application of the voltage generation circuit of the invention, the first booster module outputs the first boosted voltage in either of the program mode and the erase mode, while outputting a third boosted voltage in the read mode. The control voltage generation circuit generates a voltage corresponding to the read mode as the control voltage, based on the third boosted voltage, in the read mode.

This arrangement reduces the required number of booster modules, thus desirably reducing the size and the power consumption of the whole memory device.

In one preferable embodiment of the invention, each of the first through third booster modules includes: an oscillation circuit that carries out an oscillating operation to output a clock signal; a charge pump circuit that boosts the power supply voltage and outputs the boosted voltage, in response to the clock signal from the oscillation circuit; and a level sense circuit that controls the oscillating operation of the oscillation circuit to make the boosted voltage output from the charge pump circuit equal to a setting voltage specified for each corresponding working mode.

This arrangement facilitates construction of the first through the third booster modules.

In the non-volatile semiconductor memory device, for which the voltage generation circuit of the invention is applied, each of the multiple non-volatile memory elements may be constructed as a twin memory cell that is controlled by one word gate and two control gates.

This structure allows for the operations in the multiple working modes, for example, in the program, the erase, the verify, and the read modes, with regard to the memory cell array including twin memory cells.

In the non-volatile semiconductor memory device, for which the voltage generation circuit of the invention is applied, each of the multiple non-volatile memory elements may have an ONO film that includes an oxide film (O), a nitride film (N), and an oxide film (O) and functions as a trap site of electric charge.

This structure enables control voltages to be generated in the non-volatile semiconductor memory device using MONOS non-volatile memory elements.

The present invention is not limited to the voltage generation circuit discussed above. Another application of the invention is a non-volatile semiconductor memory device including the voltage generation circuit.

These and other objects, features, aspects, and advantages of the present invention will become more apparent from the following detailed description of the preferred embodiment with the accompanying drawings.

BRIEF DESCRIPTION OF THE DRAWINGS

FIG. 6 shows control voltages generated corresponding to respective working modes by the control voltage generation circuit;

DESCRIPTION OF THE PREFERRED EMBODIMENTS

Figure 1:
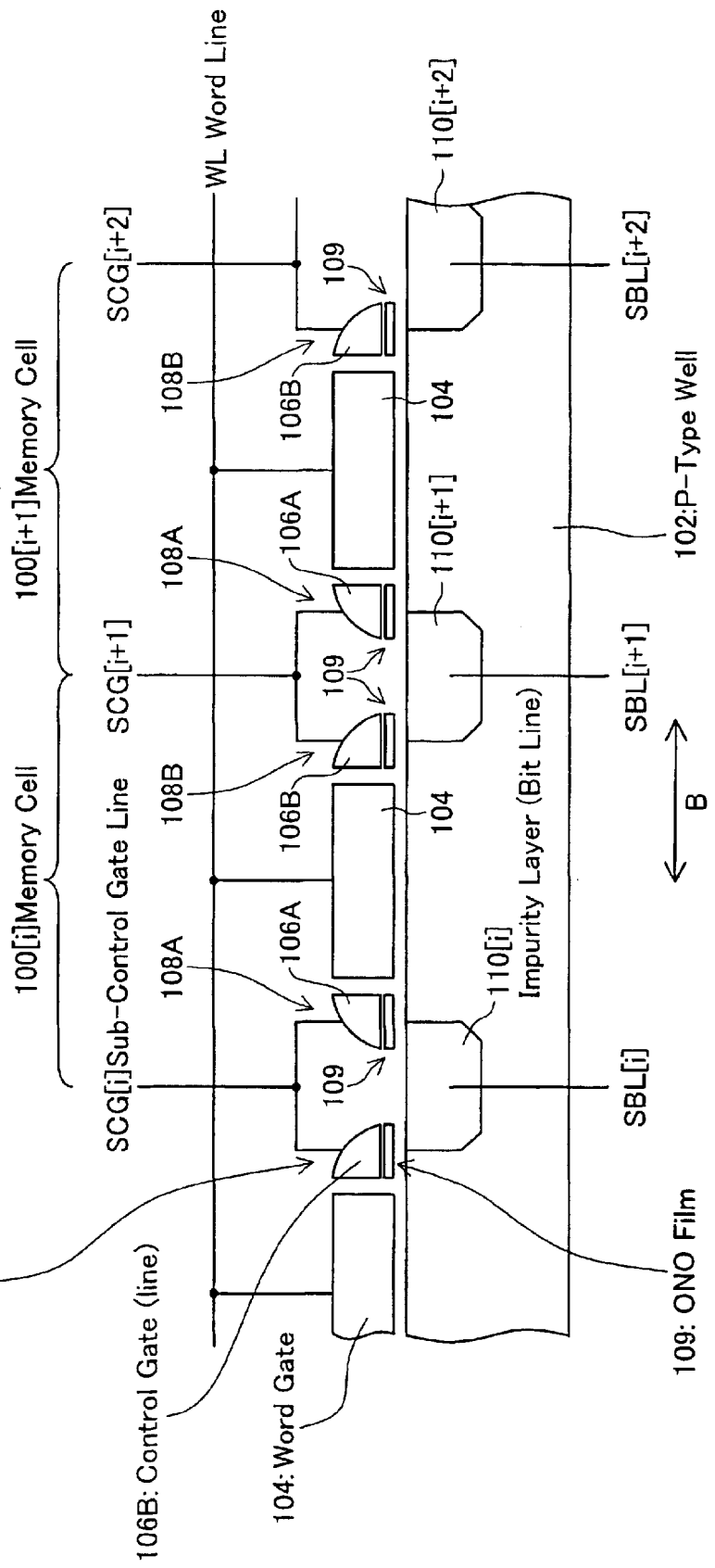
FIG. 1 is a sectional view schematically illustrating the structure of twin memory cells.

One mode of carrying out the invention is discussed below as a preferred embodiment in the following sequence:

A. Structure and Operations of Memory Cell
B. Construction and Operations of Non-Volatile Semiconductor Memory Device
C. Structure and Operations of Voltage Generation Circuit
   C1. Structure and Operations of Booster Circuit
   C2. Structure and Operations of Control Voltage Generation Circuit
   C3. Effects of Embodiment
D. Modifications A. Structure and Operations of Memory Cell The description first regards the structure and operations of a twin memory cell used as a storage element of a memory cell array in a non-volatile semiconductor memory device. FIG. 1 is a sectional view schematically illustrating the structure of twin memory cells.

As shown in FIG. 1, multiple twin memory cells 100 ( . . . , 100[i], 100[i+1], . . . , where i is a positive number of not less than 1) are arrayed in a direction B (hereafter referred to as the row direction or the word line direction) on a P-type well 102. A plurality of the twin memory cells 100 are also arrayed in a column direction or bit line direction (that is, the direction perpendicular to the sheet surface of FIG. 1). The twin memory cells 100 thus arranged in a matrix constitute a memory cell array 22.

Each of the twin memory cells 100 includes a word gate 104 formed on the P-type well 102 via a gate insulating film, a first memory element (MONOS memory element) 108A with a first control gate 106A, and a second memory element (MONOS memory element) 108B with a second control gate 106B.

Each of the first and the second memory elements 108A and 108B has an ONO film 109 of an oxide film (O), a nitride film (N), and an oxide film (O) depositing on the P-type well 102. The ONO film 109 is capable of trapping electric charges. The first control gate 106A and the second control gate 106B are formed on the respective ONO films 109 of the first memory element 108A and the second memory element 108B. The working statuses of the first and the second MONOS memory elements 108A and 108B are controlled respectively by the first and the second control gates 106A and 106B, which are composed of polysilicon corresponding to the metal M of the MONOS structure. The first and the second control gates 106A and 106B may otherwise be composed of a conductive material, such as a silicide.

The word gate 104 made of, for example, a polysilicon-containing material, is formed in an electrically insulated manner between the first and the second memory elements 108A and 108B. The voltage applied onto the word gate 104 specifies selection of either the first memory element 108A or the second memory element 108B of each twin memory cell 100.

As described above, each twin memory cell 100 has the first and the second MONOS memory elements 108A and 108B with the split gates (the first and the second control gates 106A and 106B). One word gate 104 is shared by the first and the second MONOS memory elements 108A and 108B.

Each of the first and the second MONOS memory elements 108A and 108B independently functions as a trap site of electric charge. The word gates 104 controlling the trap of electric charge are arranged at preset intervals in the direction B (in the row direction) and are commonly connected with one word line WL composed of, for example, polycide, as shown in FIG. 1. Supply of a predetermined control voltage to the word line WL allows for selection of at least one of the first and the second memory elements 108A and 108B in each of the twin memory cells 100 arrayed on an identical row.

The respective control gates 106A and 106B are extended in the column direction to be shared by multiple twin memory cells 100 arrayed on an identical column and function as control gate lines. The mutually adjacent control gates 106A and 106B included in each pair of the twin memory cells 100 adjoining to each other in the row direction are commonly connected with a sub-control gate line SCG ( . . . , SCG[i], SCG[i+1], . . . ). The sub-control gate lines SCG are made of an upper metal layer, which are located above the word gates 104, the control gates 106A and 106B, and the word lines WL. The arrangement of independently applying a control voltage onto each sub-control gate line SCG allows for independent control of the two memory elements 108A and 108B of each memory cell 100, as discussed later.

An impurity layer 110 ( . . . , 110[i], 110[i+1], . . . ) is formed in the P-type well 102 between the mutually adjacent memory elements 108A and 108B included in each pair of the twin memory cells 100 adjoining to each other in the row direction. These impurity layers 110 are, for example, n-type impurity layers formed in the P-type well 102 and are extended in the column direction to be shared by multiple twin memory cells 100 arrayed on an identical column and function as sub-bit lines SBL ( . . . , SBL[i], SBL[i+1], . . . ).

Application of a control voltage to each sub-bit line SBL and detection of an electric current enable the electric charge (information) to be read from and programmed or written into one memory element of each memory cell 100 specified by the word line WL and the sub-control gate line SCG.

B. Construction and Operations of Non-Volatile Semiconductor Memory Device

Figure 2:
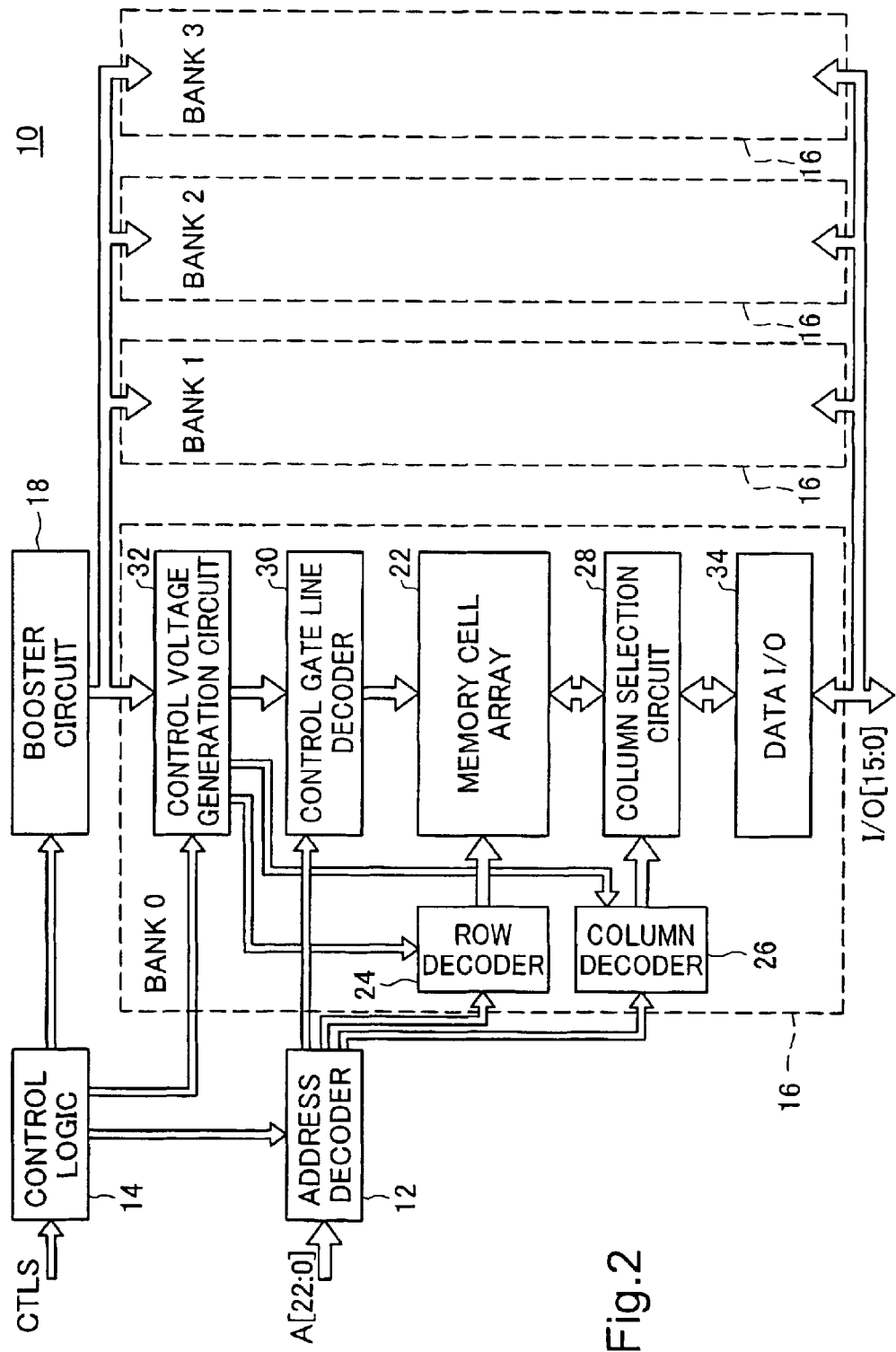
FIG. 2 is a block diagram schematically illustrating the general construction of a non-volatile semiconductor memory device including the twin memory cells of FIG. 1.

FIG. 2 is a block diagram schematically illustrating the general construction of a non-volatile semiconductor memory device 10 including the twin memory cells 100 of FIG. 1. The non-volatile semiconductor memory device 10 has four blocks 16 called banks and an address decoder 12, a control logic 14, and a booster circuit 18, which are provided to be shared by the four banks 16.

The control logic 14 controls the address decoder 12, the booster circuit 18, and a control voltage generation circuit 32 in each of the banks 16 (discussed later), in response to an input group of control signals CLTS.

The address decoder 12 decodes an address signal for specifying a target non-volatile memory element (selected element) for access. In the illustrated example of FIG. 2, a 23-bit address signal A[22:0] is input into the address decoder 12.

In response to a 2-bit address signal of the 23-bit address signal A[22:0], for example, in response to an upper-most 2-bit address signal A[22:21], one bank is selected among the four banks 16. The address signal used for selection of one bank is not restricted to the upper-most 2-bit address signal. The upper bits are, however, generally allocated to selection of one bank. In a 2-bank structure, instead of the 4-bank structure, a 1-bit address signal is used for selection of one bank. In an 8-bank structure, on the other hand, a 3-bit address signal is used for selection of one bank. Namely the number of bits in the address signal utilized for selection of one bank depends upon the number of banks.

Each bank 16 includes a memory cell array 22, a row decoder 24, a column decoder 26, a column selection circuit 28, a control gate line decoder 30, a control voltage generation circuit 32, and a data I/O 34.

The control voltage generation circuit 32 generates various control voltages required to gain access to a selected element in the memory cell array 22, in response to boosted voltages supplied from the booster circuit 18 as discussed later. The booster circuit 18 and the control voltage generation circuit 32 correspond to the voltage generation circuit of the present invention. The details of the booster circuit 18 and the control voltage generation circuit 32 will be described later.

The row decoder 24 activates a word line corresponding to the selected element specified by the address decoder 12, while inactivating other word lines. Control voltages required for activation and inactivation of word lines are supplied from the control voltage generation circuit 32 to the row decoder 24.

The column decoder 26 selects a bit line corresponding to the selected element specified by the address decoder 12 via the column selection circuit 28 and connects the selected bit line to a sense amplifier or a write circuit (not shown) in the data I/O 34. Control voltages required for selection and non-selection of bit lines are supplied from the control voltage generation circuit 32 to the column decoder 26.

The control gate line decoder 30 supplies adequate control voltages to control gates corresponding to the selected element specified by the address decoder 12 and the other non-selected non-volatile memory elements (non-selected elements) via control gate lines connecting with the respective control gates. Control voltages for controlling the respective control gates are supplied from the control voltage generation circuit 32 to the control gate line decoder 30.

The data I/O 34 takes charge of output of reading data and input of writing data.

C. Structure and Operations of Voltage Generation Circuit

A diversity of different voltages are required corresponding to various working modes, that is, read, program, erase, verify, and standby modes, as the control voltages given for access to the twin memory cell. The control voltage generation circuit 32 of the voltage generation circuit generates the diverse voltages corresponding to the respective working modes, in response to boosting voltages output from the booster circuit 18.

C1. Structure and Operations of Booster Circuit

Figure 3:
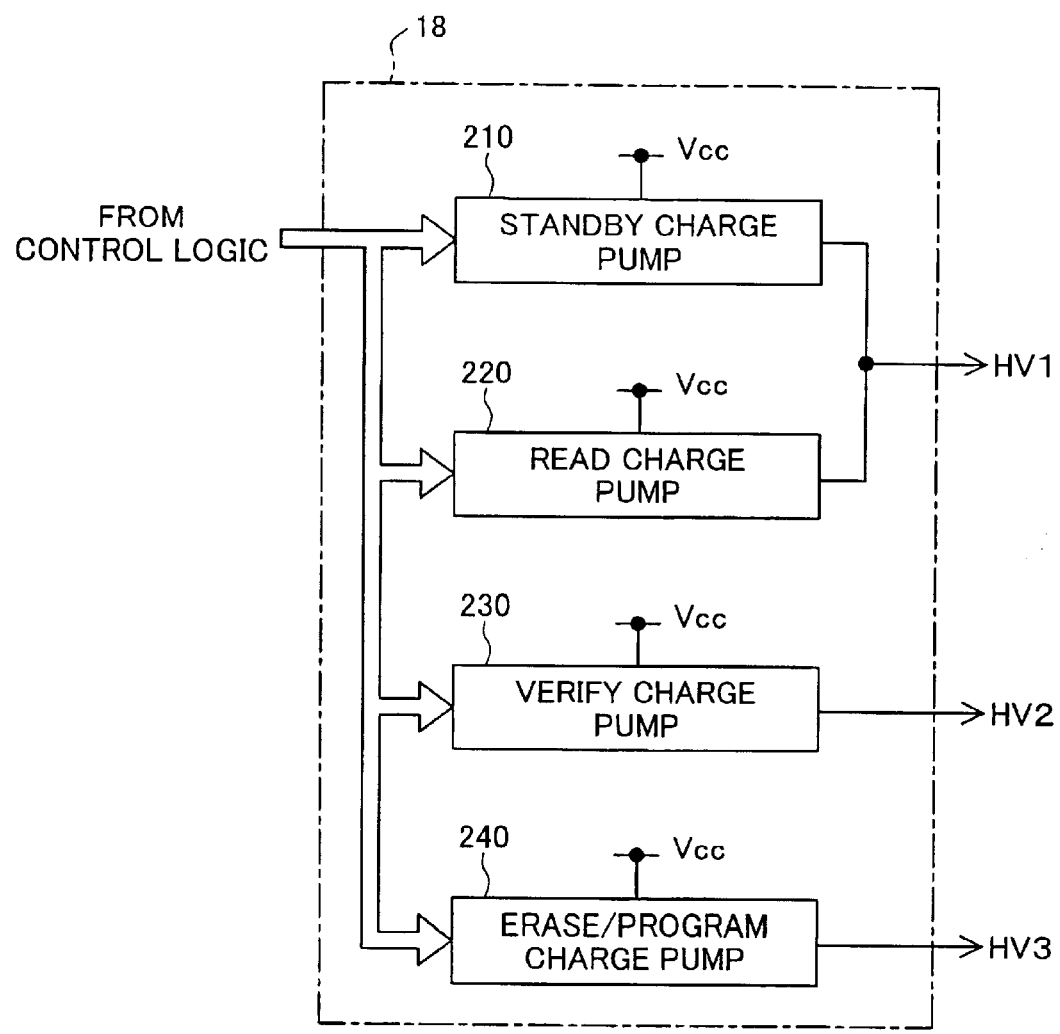
FIG. 3 is a block diagram showing the structure of a booster circuit included in a voltage generation circuit in one embodiment of the invention.

FIG. 3 is a block diagram showing the structure of the booster circuit 18 included in the voltage generation circuit in one embodiment of the invention. As shown in FIG. 3, the booster circuit 18 includes a standby charge pump 210, a read charge pump 220, a verify charge pump 230, and an erase/program charge pump 240. The booster circuit 18 also includes charge pumps for negative voltages, in addition to these charge pumps 210 through 240. The charge pumps for negative voltages are, however, not essential for the present invention and are thus not illustrated nor described here.

In response to control signals from the control logic 14, the standby charge pump 210 and the read charge pump 220 boost a power supply voltage Vcc and outputs a boosted voltage HV1. The verify charge pump 230 outputs a boosted voltage HV2, whereas the erase/program charge pump 240 outputs a boosted voltage HV3.

The standby charge pump 210 is actuated in the standby mode, whereas the read charge pump 220, the verify charge pump 230, and the erase/program charge pump 240 are actuated in the active mode, that is, in any of the read, program, erase, and verify modes. The verify charge pump 230 and the erase/program charge pump 240 may be continuously activated both in the standby mode and in the active mode. The arrangement of inactivating the verify charge pump 230 and the erase/program charge pump 240 in the standby mode is, however, preferable since it advantageously reduces the power consumption.

In a concrete example, in the standby mode, the standby charge pump 210 boosts a power supply voltage Vcc of 1.8 V to 5.0 V and outputs the boosted voltage HV1 of 5.0 V. In the active mode, the read charge pump 220 similarly boosts the power supply voltage Vcc of 1.8 V to 5.0 V and outputs the boosted voltage HV1 of 5.0 V. In the active mode, the verify charge pump 230 boosts the power supply voltage Vcc of 1.8 V to 5.0 V and outputs the boosted voltage HV2 of 5.0 V, while the erase/program charge pump 240 boosts the power supply voltage Vcc of 1.8 V to 8.0 V and outputs the boosted voltage HV3 of 8.0 V.

The read charge pump 220 has a large current capacity suppliable to a load, and is capable of supplying a sufficient level of electric power required for the memory cell array 22 in the read mode. The standby charge pump 210, on the other hand, has a smaller current capacity suppliable to the load, compared with the read charge pump 220. The standby charge pump 210 is thus capable of holding the boosted voltage sufficient to the level of a standby voltage, but can not supply the sufficient level of electric power required for the memory cell array 22 in the read mode. The standby charge pump 210, however, has a less consumption of electric current, because of the smaller suppliable current capacity, than the read charge pump 220.

Figure 4:
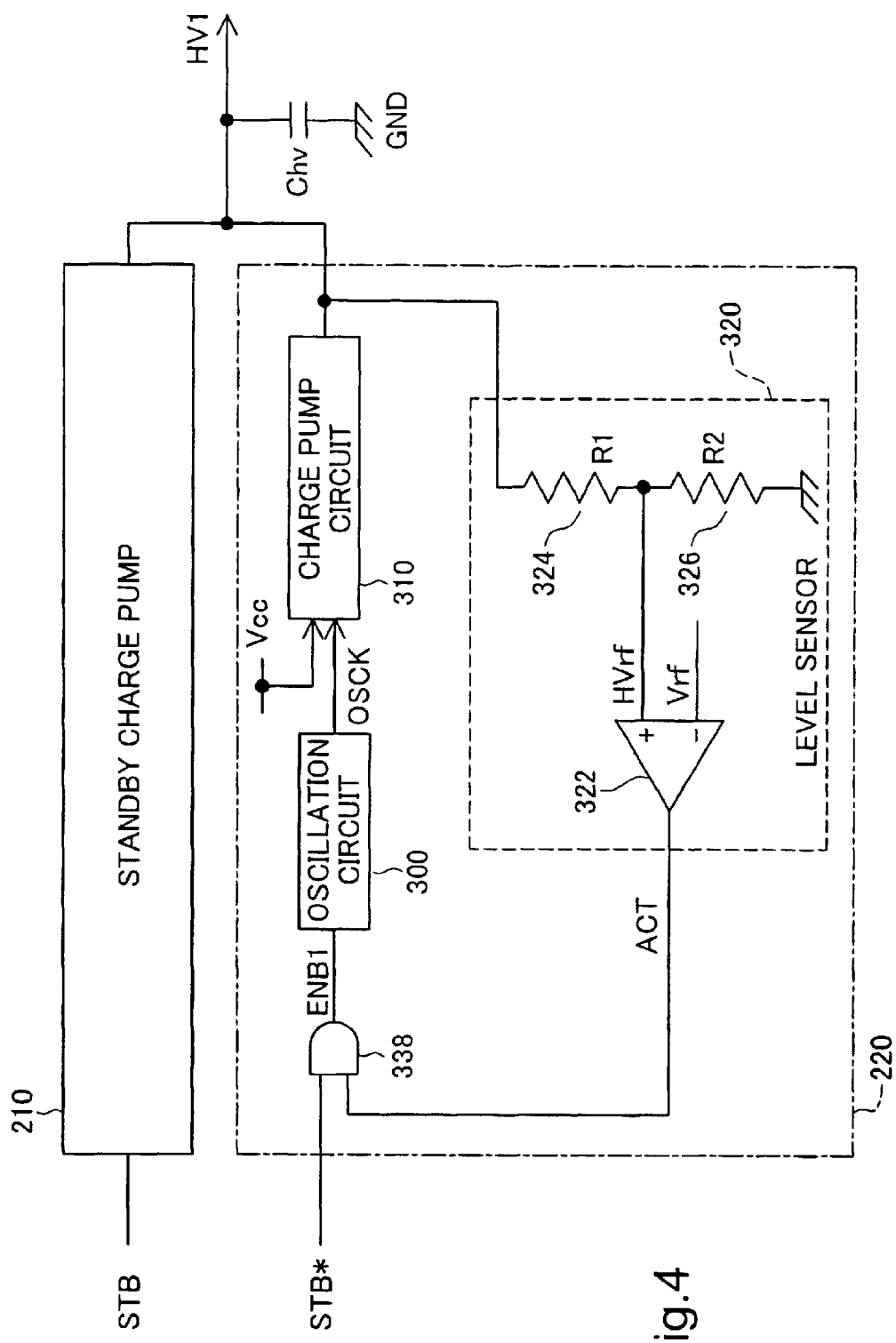
FIG. 4 is a circuit diagram showing the concrete structure of a read charge pump that outputs a boosted voltage HV1 in the booster circuit of FIG. 3.

FIG. 4 is a circuit diagram showing the concrete structure of the read charge pump 220 that outputs the boosted voltage HV1 in the booster circuit 18 of FIG. 3. As shown in FIG. 4, the read charge pump 220 mainly includes an oscillation circuit 300, a charge pump circuit 310, and a level sensor 320.

The oscillation circuit 300 outputs a clock signal OSCK, which is to be supplied to the charge pump circuit 310, in response to an enable signal ENB1 from an AND gate 338. The oscillating operation of the oscillation circuit 300 is stopped at a low level (inactive level) of the enable signal ENB1, while being started at a high level (active level) of the enable signal ENB1.

The enable signal ENB1 is an AND signal representing a logical product of a standby mode signal STB* having negative polarity from the control logic 14 and a detection signal ACT from the level sensor 320 (discussed later). The read charge pump 220 controls the start/stop of the oscillating operation of the oscillation circuit 300 and the boosting operation of the charge pump circuit 310 at a high level (active level) of the standby mode signal STB* having the negative polarity, that is, in the active mode or in any of the read, program, erase, and verify modes.

The charge pump circuit 310 boosts the power supply voltage Vcc in response to the clock signal OSCK supplied from the oscillation circuit 300 and outputs the boosted voltage HV1. The charge pump circuit 310 has a sufficiently large current capacity to supply the generated voltage to the subsequent loading (for example, the memory cell array 22) in the read mode.

The level sensor 320 detects whether the boosted voltage HV1 is higher than or lower than a desired voltage, for example, 5.0 V, and feeds back the detection signal ACT to the AND gate 338.

The level sensor 320 has a comparator 322. A reference voltage Vrf is input into a negative input terminal (−) of the comparator 322, whereas a detected voltage HVrf, which is a division of the boosted voltage HV, is input into a positive input terminal (+) of the comparator 322.

The detected voltage HVrf is obtained by dividing the boosted voltage HV1 by means of a voltage division circuit consisting of a first resistance 324 and a second resistance 326.

The oscillation circuit 300, the charge pump circuit 310, and the level sensor 320 constitute a feedback circuit, which functions to make the detected voltage HVrf equal to the reference voltage Vrf. The boosted voltage HV1 is expressed as:

$$HV1 = Vrf \cdot (1 + R1/R2) \qquad (1)$$

where R1 and R2 respectively denote values of the first and the second resistances 324 and 326.

As clearly understood from Equation (1) given above, the boosted voltage HV1 is settable to a desired level by regulating the values R1 and R2 of the first and the second resistances 324 and 326. In the structure of this embodiment, the boosted voltage HV1 is set equal to 5.0 V in the read mode, as mentioned above.

In the read charge pump 220, the oscillating operation of the oscillation circuit 300 and the boosting operation of the charge pump circuit 310 are controlled according to the level of the boosted voltage HV1 detected by the level sensor 320. The control accordingly sets the output voltage (boosted voltage) HV1 of the charge pump circuit 310 equal to 5.0 V in the read mode.

Like the read charge pump 220, the standby charge pump 210 fundamentally includes an oscillation circuit (not shown), a charge pump circuit (not shown), and a level sensor (not shown).

Compared with the charge pump circuit 310 in the read charge pump 220, the charge pump circuit in the standby charge pump 210 has a smaller current capacity suppliable to the subsequent loading (for example, the memory cell array 12). The charge pump circuit boosts the power supply voltage Vcc in response to a clock signal from the oscillation circuit and outputs the boosted voltage HV1.

An AND signal representing a logical product of a standby mode signal STB from the control logic 14 and a detection signal from the level sensor is input into the oscillation circuit. The oscillation circuit outputs a clock signal, which is to be supplied to the charge pump circuit, in response to this AND signal. The standby charge pump 210 controls the start/stop of the oscillating operation of the oscillation circuit and the boosting operation of the charge pump circuit only at a high level (active level) of the standby mode signal STB, that is, only in the standby mode.

A pool capacitor Chv is disposed between output terminals of the charge pumps 210 and 220 and a reference potential point (GND). The pool capacitor Chv pools the boosted voltage HV1.

Like the read charge pump 220, each of the other charge pumps, that is, the verify charge pump 230 and the erase/program charge pump 240, fundamentally includes an oscillation circuit (not shown), a charge pump circuit (not shown), and a level sensor (not shown). The values of resistances in a voltage division circuit included in the level sensor are adjusted to set a desired voltage to the boosted voltage output from each charge pump.

C2. Structure and Operations of Control Voltage Generation Circuit

The control voltage generation circuit 32 generates diverse voltages corresponding to the working modes as multiple control voltages required for access, in response to the boosted voltages HV1, HV2, and HV3 output from the booster circuit 18.

Figure 5:
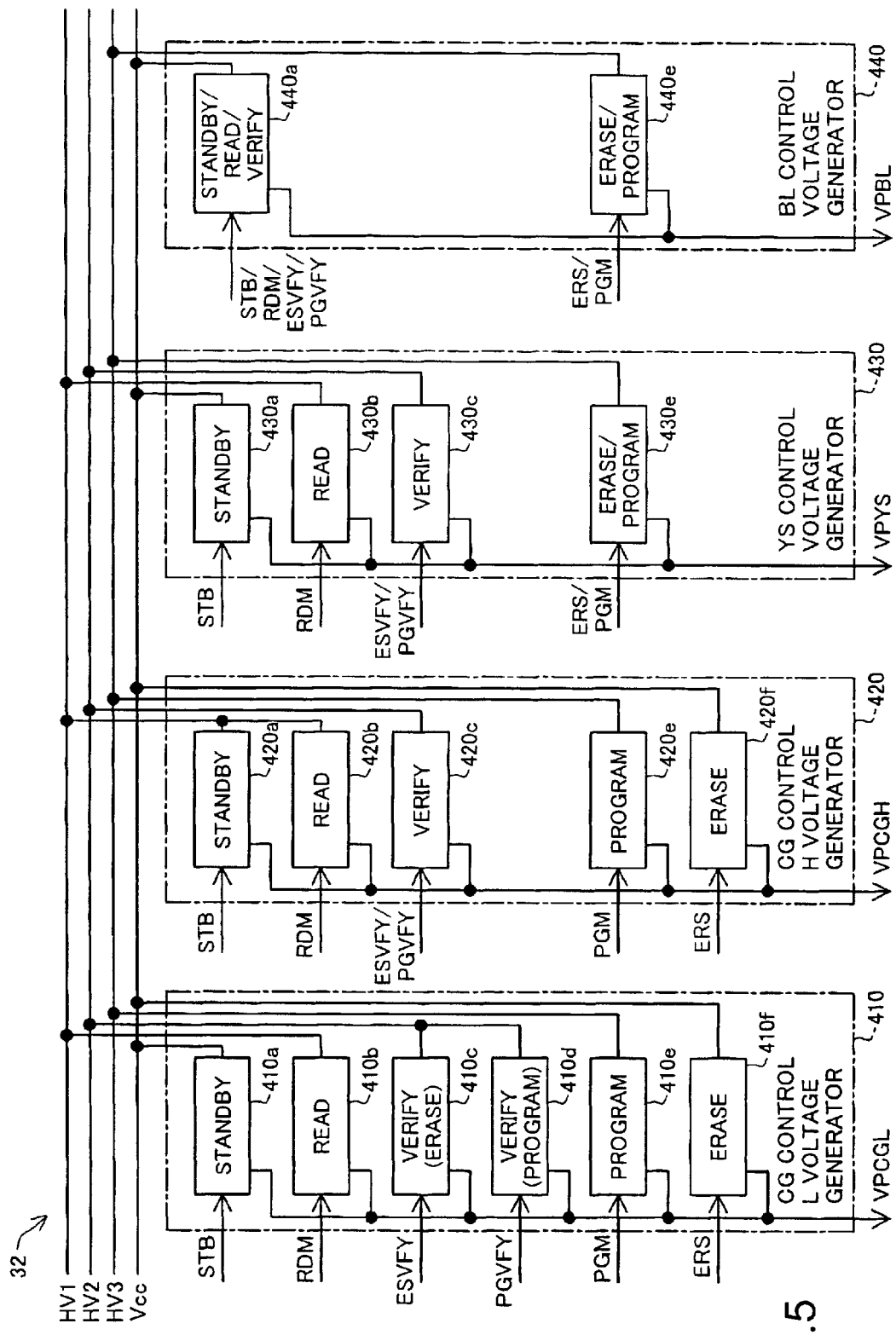
FIG. 5 is a block diagram illustrating the structure of a control voltage generation circuit included in the voltage generation circuit in one embodiment of the invention.

FIG. 5 is a block diagram illustrating the structure of the control voltage generation circuit 32 included in the voltage generation circuit in one embodiment of the invention. The control voltage generation circuit 32 shown in FIG. 5 includes a CG control L voltage generator 410, a CG control H voltage generator 420, a YS control voltage generator 430, and a BL control voltage generator 440.

The CG control L voltage generator 410 generates a low-level (L) voltage VPCGL as a control gate (CG) control voltage (CG control L voltage). The CG control H voltage generator 420 generates a high-level (H) voltage VPCGH as a control gate (CG) control voltage (CG control H voltage). The YS control voltage generator 430 generates a YS control voltage VPYS as a bit line (BL) selection control voltage for controlling selection of a bit line (BL) carried out by the column selection circuit 28 (see FIG. 1). The BL control voltage generator 440 generates a BL control voltage VPBL as a bit line control voltage for execution of the erase operation in the erase mode or execution of the program operation in the program mode.

The control voltage generation circuit 32 also includes a variety of other control voltage generators, such as WL (word line) control voltage generators. These generators are, however, not essential for the invention and are thus neither illustrated nor described here.

FIG. 6 shows the control voltages generated corresponding to the respective working modes by the control voltage generation circuit 32. The respective control voltage generators 410 through 440 included in the control voltage generation circuit 32 output the control voltages VPCGL, VPCGH, VPYS, and VPBL corresponding to the respective working modes as shown in FIG. 6. The following describes the structure and the operations of the respective control voltage generators.

(1) CG Control L Voltage Generator 410

As shown in FIG. 5, the CG control L voltage generator 410 includes a standby voltage generation circuit 410a, a read voltage generation circuit 410b, an erase verify voltage generation circuit 410c, a program verify voltage generation circuit 410d, a program voltage generation circuit 410e, and an erase voltage generation circuit 410f, which generate voltages corresponding to respective working modes, that is, standby, read, erase verify, program verify, program, and erase modes, as the CG control L voltage VPCGL. The outputs from these generation circuits 410a through 410f are connected in common.

The standby voltage generation circuit 410a outputs the power supply voltage Vcc as the CG control L voltage VPCGL at the active level of the standby mode signal STB output from the control logic 14, that is, in the standby mode, as shown in FIG. 6. The standby voltage generation circuit 410a is readily constructed by a switch circuit of a transistor, which is controlled on and off in response to the standby mode signal STB. Among the other voltage generation circuits discussed below, any voltage generation circuit that outputs the reference voltage as the control voltage may be constructed like the standby voltage generation circuit 410a.

The read voltage generation circuit 410b generates a voltage of 1.5 V on the basis of the boosted voltage HV1 of 5.0 V output from the read charge pump 220 (see FIG. 3) and outputs the generated voltage of 1.5 V as the CG control L voltage VPCGL at the active level of a read mode signal RDM output from the control logic 14, that is, in the read mode, as shown in FIG. 6. The read voltage generation circuit 410b is readily constructed by a constant voltage generation circuit.

Figure 7:
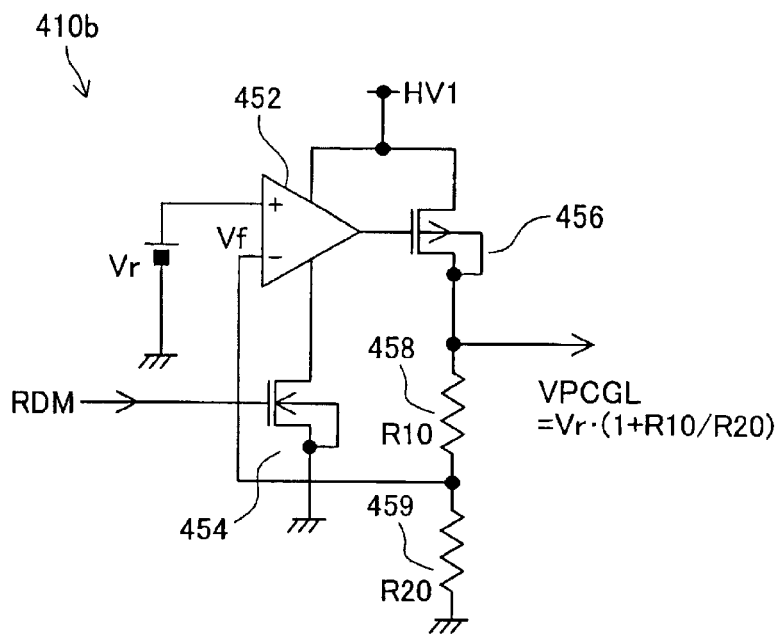
FIG. 7 shows the structure of a constant voltage generation circuit constructed as a read voltage generation circuit.

FIG. 7 shows the structure of the constant voltage generation circuit constructed as the read voltage generation circuit 410b. The read voltage generation circuit 410b has an operational amplifier 452. The output of the operational amplifier 452 is given as the CG control L voltage VPCGL via a transistor 456 functioning as a source follower.

A reference voltage Vr is input into a positive input terminal (+) of the operational amplifier 452, whereas a divisional voltage Vf of the output control voltage VPCGL is input into a negative input terminal (−) of the operational amplifier 452. The divisional voltage Vf is obtained by dividing the CG control L voltage VPCGL by means of a voltage division circuit consisting of a first resistance 458 and a second resistance 459.

The operational amplifier 452, the transistor 456, and the two resistances 458 and 459 constitute a feedback circuit, which functions to make the divisional voltage Vf equal to the reference voltage Vr. The CG control L voltage VPCGL is expressed as:

$$VPCGL = Vr \cdot (1 + R10/R20) \quad (2)$$

where R10 and R20 respectively denote values of the first and the second resistances 458 and 459.

As clearly understood from Equation (2) given above, the CG control L voltage VPCGL is adjustable to a desired level by regulating the values R10 and R20 of the first and the second resistances 458 and 459 or regulating the reference voltage Vr.

The boosted voltage HV1 as the reference is input into one of two power supply input terminals of the operational amplifier 452, whereas a reference potential point GND (0 V) is input into the other input terminal via a transistor 454 functioning as a switch. The read mode signal RDM is input into a gate terminal of this transistor 454. At a high level (active level) of the read mode signal RDM, that is, in the read mode, the transistor 454 is on to activate the operational amplifier 452. This results in execution of the feedback operation discussed above to generate the voltage expressed by Equation (2) given above as the CG control L voltage VPCGL. At a low level (inactive level) of the read mode signal RDM, that is, in another working mode, on the other hand, the transistor 454 is off to inactivate the operational amplifier 452 and the whole read voltage generation circuit 410b. While the read voltage generation circuit 410b is inactive, a voltage generation circuit corresponding to the another working mode generates and outputs a voltage as the CG control L voltage VPCGL.

Among the other voltage generation circuits discussed below, any voltage generation circuit that outputs a desired voltage as the control voltage on the basis of the boosted voltage may be constructed like the read voltage generation circuit 410b. The structures of the standby voltage generation circuit 410a and the read voltage generation circuit 410b are, however, not restrictive at all, but a diversity of other circuit structures may be applicable to each voltage generation circuit.

The erase verify voltage generation circuit 410c generates a voltage of 1.2 V on the basis of the boosted voltage HV2 of 5.0 V output from the verify charge pump 230 (see FIG. 3) and outputs the generated voltage of 1.2 V as the CG control L voltage VPCGL at an active level of an erase verify mode signal ESVFY from the control logic 14, that is, in the verify mode after execution of the erase mode, as shown in FIG. 6.

The program verify voltage generation circuit 410d generates a voltage of 1.8 V on the basis of the boosted voltage HV2 of 5.0 V and outputs the generated voltage of 1.8 V as the CG control L voltage VPCGL at an active level of a program verify mode signal PGVFY from the control logic 14, that is, in the verify mode after execution of the program mode, as shown in FIG. 6.

The program voltage generation circuit 410e generates a voltage of 2.5 V on the basis of the boosted voltage HV3 of 8.0 V output from the erase/program charge pump 240 (see FIG. 3) and outputs the generated voltage of 2.5 V as the CG control L voltage VPCGL at an active level of a program mode signal PGM from the control logic 14, that is, in the program mode, as shown in FIG. 6.

The erase voltage generation circuit 410f outputs the power supply voltage Vcc as the CG control L voltage VPCGL at an active level of an erase mode signal ERS from the control logic 14, that is, in the erase mode, as shown in FIG. 6.

(2) CG Control H Voltage Generator 420

Like the CG control L voltage generator 410, the CG control H voltage generator 420 basically includes multiple voltage generation circuits to generate voltages corresponding to the respective working modes, that is, standby, read, erase verify, program verify, program, and erase modes. The outputs from these generation circuits are connected in common. The difference from the CG control L voltage generator 410 is that the CG control H voltage generator 420 has a common verify voltage generation circuit 420c for both the erase verify mode and the program verify mode, since an identical voltage is to be output in these working modes as shown in FIG. 6. Different voltages are to be output in each working mode as the CG control H voltage VPCGH and as the CG control L voltage VPCGL as shown in FIG. 6. The voltages generated by the respective voltage generation circuits in the CG control H voltage generator 420 are thus different from the voltages generated by the corresponding voltage generation circuits in the CG control L voltage generator 410.

A read voltage generation circuit 420b generates a voltage of 3.0 V on the basis of the boosted voltage HV1 of 5.0 V output from the read charge pump 220 and outputs the generated voltage of 3.0 V as the CG control H voltage VPCGH in the read mode, as shown in FIG. 6.

A standby voltage generation circuit 420a generates a voltage approximate to 3.0 V, which is the CG control H voltage VPCGH in the read mode, on the basis of the boosted voltage HV1 of 5.0 V and outputs the generated voltage of approximately 3.0 V as the CG control H voltage VPCGH in the standby mode, as shown in FIG. 6.

The verify voltage generation circuit 420c generates a voltage of 3.0 V on the basis of the boosted voltage HV2 of 5.0 V output from the verify charge pump 230 and outputs the generated voltage of 3.0 V as the CG control H voltage VPCGH in the erase verify mode and in the program verify mode, as shown in FIG. 6.

A program voltage generation circuit 420e generates a voltage of 2.5 V on the basis of the boosted voltage HV3 of 8.0 V output from the erase/program charge pump 240 and outputs the generated voltage of 2.5 V as the CG control H voltage VPCGH in the program mode, as shown in FIG. 6.

An erase voltage generation circuit 420f outputs the power supply voltage Vcc as the CG control H voltage VPCGH in the erase mode, as shown in FIG. 6.

(3) YS Control Voltage Generator 430

Like the CG control L voltage generator 410, the YS control voltage generator 430 basically includes multiple voltage generation circuits to generate voltages corresponding to the respective working modes, that is, standby, read, erase verify, program verify, program, and erase modes. The outputs from these generation circuits are connected in common. One difference from the CG control L voltage generator 410 is that the YS control voltage generator 430 has a common verify voltage generation circuit 430c for both the erase verify mode and the program verify mode, since an identical voltage is to be output in these working modes as shown in FIG. 6. Another difference is that the YS control voltage generator 430 has a common erase/program voltage generation circuit 430e for both the erase mode and the program mode, since an identical voltage is to be output in these working modes as shown in FIG. 6. Different voltages are to be output in each working mode as the YS control voltage VPYS and as the CG control L voltage VPCGL as shown in FIG. 6. The voltages generated by the respective voltage generation circuits in the YS control voltage generator 430 are thus different from the voltages generated by the corresponding voltage generation circuits in the CG control L voltage generator 410.

A standby voltage generation circuit 430a outputs the power supply voltage Vcc as the YS control voltage VPYS in the standby mode, as shown in FIG. 6.

A read voltage generation circuit 430b generates a voltage of 4.5 V on the basis of the boosted voltage HV1 of 5.0 V output from the read charge pump 220 and outputs the generated voltage of 4.5 V as the YS control voltage VPYS in the read mode, as shown in FIG. 6.

The verify voltage generation circuit 430c generates a voltage of 4.5 V on the basis of the boosted voltage HV2 of 5.0 V output from the verify charge pump 230 and outputs the generated voltage of 4.5 V as the YS control voltage VPYS in the erase verify mode and in the program verify mode, as shown in FIG. 6.

The erase/program voltage generation circuit 430e outputs the boosted voltage HV3 of 8.0 V, which is output from the erase/program charge pump 240, as the YS control voltage VPYS in the program mode and in the erase mode, as shown in FIG. 6.

(4) BL Control Voltage Generator 440

Like the CG control L voltage generator 410, the BL control voltage generator 440 basically includes multiple voltage generation circuits to generate voltages corresponding to the respective working modes, that is, standby, read, erase verify, program verify, program, and erase modes. The outputs from these generation circuits are connected in common. One difference from the CG control L voltage generator 410 is that the BL control voltage generator 440 has a common standby/read/verify voltage generation circuit 440a for all the standby mode, the read mode, the erase verify mode, and the program verify mode, since an identical voltage is to be output in these working modes as shown in FIG. 6. Another difference is that the BL control voltage generator 440 has a common erase/program voltage generation circuit 440e for both the erase mode and the program mode, since an identical voltage is to be output in these working modes as shown in FIG. 6. Different voltages are to be output in each working mode as the BL control voltage VPBL and as the CG control L voltage VPCGL as shown in FIG. 6. The voltages generated by the respective voltage generation circuits in the BL control voltage generator 440 are thus different from the voltages generated by the corresponding voltage generation circuits in the CG control L voltage generator 410.

The standby/read/verify voltage generation circuit 440a outputs the power supply voltage Vcc as the BL control voltage VPBL in any of the standby mode, the read mode, and the verify mode, as shown in FIG. 6.

The erase/program voltage generation circuit 440e generates a voltage of 5.2 V on the basis of the boosted voltage HV3 of 8.0 V output from the erase/program charge pump 240 and outputs the generated voltage of 5.2 V as the BL control voltage VPBL in the program mode and in the erase mode, as shown in FIG. 6.

C3. Effects of Embodiment

As described above, in the booster circuit 18 (FIG. 3) included in the voltage generation circuit of the embodiment, regardless of any of the active modes, that is, any of the read, the verify, the erase, and the program modes, the read charge pump 220, the verify charge pump 230, and the erase/program charge pump 240 respectively output the boosted voltage HV1 for the read mode, the boosted voltage HV2 for the verify mode, and the boosted voltage HV3 for the erase mode or the program mode, as the reference voltage for voltage generation in the control voltage generation circuit 32.

In each of the control voltage generators 410 through 440 included in the control voltage generation circuit 32, a corresponding voltage generation circuit is actuated in each working mode to generate a control voltage suitable for the working mode on the basis of the boosted voltage for the working mode as the reference voltage.

For example, in the CG control L voltage generator 410, the program mode voltage generation circuit 410e is actuated in the program mode to generate the CG control L voltage on the basis of the boosted voltage HV3 as the reference voltage. The program verify mode voltage generation circuit 410d is actuated in the program verify mode to generate the CG control L voltage on the basis of the boosted voltage HV2 as the reference voltage.

The switchover of actuation between the program voltage generation circuit 410e and the program verify voltage generation circuit 410d is implemented by means of a transistor (corresponding to the transistor 454 shown in FIG. 7), which is switched on and off in response to the input program mode signal PGM or the input program verify mode signal PGVFY. The switching operation of the transistor practically depends upon the element performances of the transistor. The transistor has a switching time of, for example, not longer than about 50 ns and allows for the high-speed switching. The voltage output as the CG control L voltage VPCGL can thus be switched over at a high speed between the voltage for the program mode and the voltage for the verify mode.

In the same manner as the CG control L voltage generator 410, any of the CG control H voltage generator 420, the YS control voltage generator 430, and the BL control voltage generator 440 allows for high-speed switchover of the output voltage as the CG control H voltage VPCGH, the YS control voltage VPYS, or the BL control voltage VPBL between the voltage for the program mode and the voltage for the verify mode.

The voltage generation circuit of the embodiment thus ensures high-speed switchover of the control voltage from the voltage for the program mode or the erase mode to the voltage for the verify mode or vice versa. This arrangement significantly shortens the time required for each program access or each erase access, compared with the prior art technique.

Figure 8:
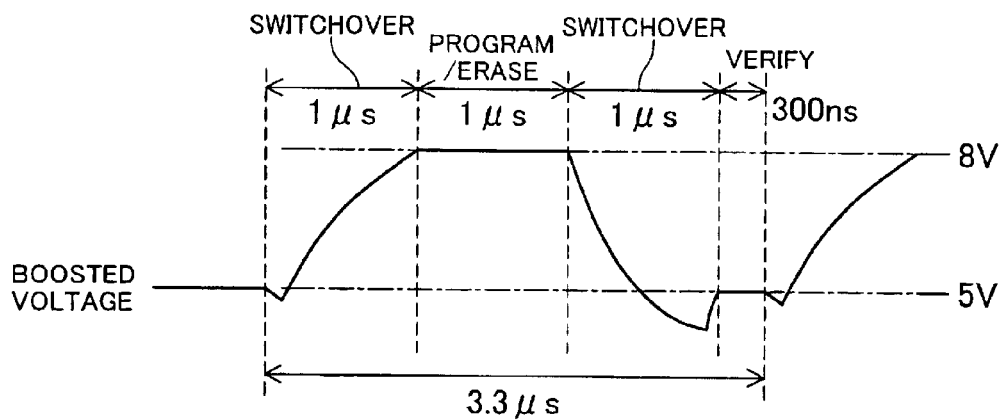
FIG. 8 shows a drawback of a booster circuit included in a prior art voltage generation circuit.

For example, it is assumed that the switching time of the control voltage is about 50 ns and that the time for program or erase is about 1 µs and the time for verify is about 300 ns. In this case, the erase/program access time is about 1.4 µs. As discussed previously, the erase/program access time is about 3.3 µs (see FIG. 8) in the prior art structure of switching over the output of the booster circuit. The structure of the embodiment thus reduces the erase/program access time to less than half and has 7 erase/program accesses at the maximum within a time of about 10 µs, which is the erase/program access time of the general non-volatile semiconductor memory device.

As clearly understood from the above description, the erase/program charge pump 240, the verify charge pump 230, and the read charge pump 220 respectively correspond to the first booster module, the second booster module, and the third booster module of the present invention. The boosted voltage HV3 for the erase mode or the program mode corresponds to the first boosted voltage of the invention, and the boosted voltage HV2 for the verify mode corresponds to the second boosted voltage of the invention.

D. Modifications

The embodiment and the applications discussed above are to be considered in all aspects as illustrative and not restrictive. There may be many modifications, changes, and alterations without departing from the scope or spirit of the main characteristics of the present invention. Some examples of possible modification are given below.

The non-volatile memory elements 108A and 108B are not restricted to the MONOS structure. The technique of the present invention is applicable to non-volatile semiconductor memory devices utilizing a variety of other twin memory cells, each of which includes one word gate and first and second control gates to independently trap the electric charges at two different places.

The booster circuit 18 of the embodiment includes the standby charge pump 210 for the standby mode, the read charge pump 220 for the read mode, the verify charge pump 230 for the verify mode, and the erase/program charge pump 240 for the erase mode or the program mode. This structure is, however, not restrictive at all.

For example, one of the read charge pump and the verify charge pump may be used commonly for both the read mode and the verify mode. This modified arrangement reduces the power consumption and the size of the whole memory device. In the executable case of dual operations to drive one of two different banks in the read mode while driving the other bank in the verify mode, however, separate read charge pump and verify charge pump are desirable to prevent the operations of one bank in the read mode from being affected by the operations of the other bank in the verify mode.

Only one charge pump, which outputs different boosted voltages corresponding to different working modes, may be used to generate the boosted voltage for the read mode and the boosted voltage for the erase mode or the program mode, like the prior art booster circuit. This modified arrangement also reduces the power consumption and the size of the whole memory device. This structure, however, does not allow for execution of dual operations to drive one of two different banks in the read mode while driving the other bank in the erase mode or in the program mode.

In the structure of the embodiment discussed above, the boosted voltage HV1 and HV2 output from the booster circuit 18 are equal to 5.0 V, and the output boosted voltage HV3 is equal to 8.0 V. The technique of the invention is, however, not restricted to these values, but may be applicable to a diversity of other values.

The scope and spirit of the present invention are indicated by the appended claims, rather than by the foregoing description.

What is claimed is:

1. A voltage generation circuit applied for a non-volatile semiconductor memory device, which has a memory cell array comprising multiple non-volatile memory elements, the non-volatile semiconductor memory device having plural working modes, a program mode for writing into each of the multiple non-volatile memory elements, an erase mode for erasing from each of the multiple non-volatile memory elements, a verify mode for reading each of the multiple non-volatile memory elements to verify either of a status of the writing and a status of the erasing, and a read mode for reading from each of the multiple non-volatile memory elements, the voltage generation circuit comprising:

a booster circuit having at least a first booster module that boosts a power supply voltage and outputs a first boosted voltage corresponding to either of the program mode and the erase mode, and a second booster module that boosts the power supply voltage and outputs a second boosted voltage, which is different from the first boosted voltage, corresponding to the verify mode; and a control voltage generation circuit that generates at least a voltage corresponding to the program mode, based on the first boosted voltage, in the program mode, a voltage corresponding to the erase mode, based on the first boosted voltage, in the erase mode, and a voltage corresponding to the verify mode, based on the second boosted voltage, in the verify mode, as control voltages to control operations of each of the multiple non-volatile memory elements.

2. A voltage generation circuit in accordance with claim 1, wherein each of the first booster module and the second booster module comprises:

an oscillation circuit that carries out an oscillating operation to output a clock signal;

a charge pump circuit that boosts the power supply voltage and outputs the boosted voltage, in response to the clock signal from the oscillation circuit; and a level sense circuit that controls the oscillating operation of the oscillation circuit to make the boosted voltage output from the charge pump circuit equal to a setting voltage specified for each corresponding working mode.

3. A voltage generation circuit in accordance with claim 1, wherein the booster circuit further comprises a third booster module that boosts the power supply voltage and outputs a third boosted voltage corresponding to the read mode, and the control voltage generation circuit generates a voltage corresponding to the read mode as the control voltage, based on the third boosted voltage, in the read mode.

4. A voltage generation circuit in accordance with claim 3, wherein each of the first through third booster modules comprises:

an oscillation circuit that carries out an oscillating operation to output a clock signal;

a charge pump circuit that boosts the power supply voltage and outputs the boosted voltage, in response to the clock signal from the oscillation circuit; and a level sense circuit that controls the oscillating operation of the oscillation circuit to make the boosted voltage output from the charge pump circuit equal to a setting voltage specified for each corresponding working mode.

5. A voltage generation circuit in accordance with claim 1, wherein the control voltage generation circuit generates a voltage corresponding to the read mode as the control voltage, based on the second boosted voltage, in the read mode.

6. A voltage generation circuit in accordance with claim 1, wherein the first booster module outputs the first boosted voltage in either of the program mode and the erase mode, while outputting a third boosted voltage in the read mode, and the control voltage generation circuit generates a voltage corresponding to the read mode as the control voltage, based on the third boosted voltage, in the read mode.

7. A voltage generation circuit in accordance with claim 6, wherein each of the first booster module and the second booster module comprises:

an oscillation circuit that carries out an oscillating operation to output a clock signal;

a charge pump circuit that boosts the power supply voltage and outputs the boosted voltage, in response to the clock signal from the oscillation circuit; and a level sense circuit that controls the oscillating operation of the oscillation circuit to make the boosted voltage output from the charge pump circuit equal to a setting voltage specified for each corresponding working mode.

8. A voltage generation circuit in accordance with claim 1, in the non-volatile semiconductor memory device, for which the voltage generation circuit is applied, each of the multiple non-volatile memory elements being constructed as a twin memory cell that is controlled by one word gate and two control gates.

9. A voltage generation circuit in accordance with claim 1, in the non-volatile semiconductor memory device, for which the voltage generation circuit is applied, each of the multiple non-volatile memory elements having an ONO film that includes an oxide film (O), a nitride film (N), and an oxide film (O) and functions as a trap site of electric charge.

10. A non-volatile semiconductor memory device comprising a voltage generation circuit in accordance with claim 1.

* * * * *